US009704822B2

(12) United States Patent
Knickerbocker et al.

(10) Patent No.: US 9,704,822 B2
(45) Date of Patent: Jul. 11, 2017

(54) BONDING SUBSTRATES USING SOLDER SURFACE TENSION DURING SOLDER REFLOW FOR THREE DIMENSIONAL SELF-ALIGNMENT OF SUBSTRATES

(71) Applicant: International Business Machines Corporation, Armonk, NY (US)

(72) Inventors: John U. Knickerbocker, Monroe, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/936,849

(22) Filed: Nov. 10, 2015

(65) Prior Publication Data

US 2017/0133345 A1      May 11, 2017

(51) Int. Cl.
*H01L 23/00*       (2006.01)
*H01L 23/544*      (2006.01)

(52) U.S. Cl.
CPC ............ *H01L 24/81* (2013.01); *H01L 23/544* (2013.01); *H01L 2223/54426* (2013.01); *H01L 2224/8113* (2013.01); *H01L 2224/81815* (2013.01); *H01L 2924/3511* (2013.01)

(58) Field of Classification Search
CPC ................... H01L 23/00; H01L 23/544; H01L 2021/60075; H01L 2021/6009
See application file for complete search history.

(56) References Cited

U.S. PATENT DOCUMENTS

| | | | | |
|---|---|---|---|---|
| 4,642,672 A | * | 2/1987 | Kitakata | H01L 21/0277 250/491.1 |
| 5,042,709 A | * | 8/1991 | Cina | G02B 6/4224 228/105 |
| 5,214,308 A | * | 5/1993 | Nishiguchi | H01L 23/13 228/180.22 |

(Continued)

OTHER PUBLICATIONS

S.H. Lee et al, "Wafer-to-Wafer Alignment for Three-Dimensional Integration: A Review," Journal of Microelectromechanical Systems, Aug. 2011, pp. 885-898, vol. 20, No. 4.

(Continued)

*Primary Examiner* — Peniel M Gumedzoe
(74) *Attorney, Agent, or Firm* — Louis J. Percello; Ryan, Mason & Lewis, LLP

(57) ABSTRACT

Methods are provided for bonding substrates together using alignment structures and solder reflow techniques which achieve self-alignment in three dimensions, as well as semiconductor structures that are formed using such methods. A first alignment structure is formed on a bonding surface of a first substrate, which includes an alignment trench formed in the bonding surface of the first substrate. A second alignment structure is formed on a bonding surface of a second substrate, which includes a bonding pad with solder formed on the bonding pad. The first and second substrates are placed together with the solder of the second alignment structure in contact with the first alignment structure. A solder reflow process causes the solder to melt and flow into the alignment trench while pulling on the bonding pad to cause the second substrate to move into alignment with the first substrate in each of X, Y, and Z directions.

20 Claims, 11 Drawing Sheets

(56) References Cited

U.S. PATENT DOCUMENTS

| | | | | |
|---|---|---|---|---|
| 5,298,460 | A | * | 3/1994 | Nishiguchi ............. H01L 23/13 228/180.22 |
| 2001/0010743 | A1 | * | 8/2001 | Cayrefourcq ........ G02B 6/4232 385/88 |
| 2009/0256251 | A1 | * | 10/2009 | Getz ....................... B81B 7/007 257/698 |
| 2010/0105160 | A1 | * | 4/2010 | Singh ................ H01L 27/14618 438/66 |
| 2014/0010496 | A1 | * | 1/2014 | Tong ................... G02B 6/4204 385/14 |

OTHER PUBLICATIONS

T. Rogers et al., "Selection of Glass, Anodic Bonding Conditions and Material Compatibility for Silicon-Glass Capacitive Sensors," Sensors and Actuators A: Physical, Jan.-Feb. 1995, pp. 113-120, vol. 46, Nos. 1-3.

\* cited by examiner

BONDING SUBSTRATES USING SOLDER SURFACE TENSION DURING SOLDER REFLOW FOR THREE DIMENSIONAL SELF-ALIGNMENT OF SUBSTRATES

TECHNICAL FIELD

This disclosure generally relates to the assembly of semiconductor package components and, more specifically, to techniques for aligning and bonding substrates together using solder reflow.

BACKGROUND

In general, conventional techniques for bonding substrates together to form package structures typically utilize lithographically defined mechanical stops in conjunction with a solder reflow process to align components in one or two dimensions. However, such alignment and packaging techniques can be ineffective to accurately align package components due to various tolerances that exist in certain fabrication and assembly processes. For example, when using high speed pick and place tools for flip-chip assembling, there can be variations in the initial chip (die) placement in a range of +/−10 μm. Such variations in placement can result in misalignment of assembled components when using mechanical stops and solder reflow techniques for alignment.

SUMMARY

Embodiments of the invention generally include methods for aligning and bonding substrates together using alignment structures and solder reflow techniques which achieve self-alignment of the bonded substrates in three dimensions, as well as semiconductor structures that are formed using such methods.

For example, one embodiment of the invention includes a method for aligning and bonding substrates. A first alignment structure is formed on a first substrate. The first alignment structure comprises an alignment trench formed in a bonding surface of the first substrate. A second alignment structure is formed on a bonding surface of a second substrate. The second alignment structure comprises a bonding pad with solder formed on the bonding pad. The bonding surfaces of the first and second substrates are placed together with at least a portion of the solder of the second alignment structure in contact with at least a portion of the first alignment structure. A solder reflow process is performed to cause the solder on the bonding pad to melt and flow into the alignment trench while pulling on the bonding pad to cause the second substrate to move into alignment with the first substrate in each of X, Y, and Z directions.

Another embodiment includes a method for aligning and bonding a plurality of dies to a substrate. A pattern of first alignment structures is formed on each of a plurality of die sites on a bonding surface of a substrate. Each of the first alignment structures comprises an alignment trench formed in the bonding surface of the substrate. A pattern of second alignment structures is formed on a bonding surface of each of a plurality of dies, wherein each of the second alignment structures comprises a bonding pad with solder formed on the bonding pad. Each of the plurality of dies is placed at a respective one of the plurality of die sites on the bonding surface of the substrate, with at least a portion of the solder of the second alignment structures in contact with at least a portion of the corresponding first alignment structures. A solder reflow process is performed to cause the solder on the bonding pads to melt and flow into the corresponding alignment trenches while pulling on the bonding pads to cause each of the plurality of dies to move into alignment with the respective one of the plurality of dies sites in each of X, Y, and Z directions.

Other embodiments of the invention will be described in following detailed description of embodiments, which is to be read in conjunction with the accompanying drawings.

BRIEF DESCRIPTION OF THE DRAWINGS

FIGS. 1A and 1B are schematic views of a first substrate at an initial stage of a process in which an alignment trench is formed in a bonding surface of the first substrate according to an embodiment of the invention, wherein FIG. 1A is a cross-sectional view of the substrate taken along line 1A-1A in FIG. 1B, and wherein FIG. 1B is plan view of the bonding surface of the first substrate.

FIGS. 2A and 2B schematically illustrate the structures shown in FIGS. 1A and 1B, respectively, after forming a wetting layer on the inner walls of the alignment trench according to an embodiment of the invention, wherein FIG. 2A is a cross-sectional view taken along line 2A-2A in FIG. 2B, and wherein FIG. 2B is plan view of the bonding surface of the first substrate.

FIGS. 3A and 3B are schematic views of a second substrate in which a bonding site metallization pattern is formed on a bonding surface of the second substrate according to an embodiment of the invention, wherein FIG. 3A is a cross-sectional view of the second substrate taken along line 3A-3A in FIG. 3B, wherein FIG. 3B is plan view of the bonding surface of the second substrate.

FIGS. 4A and 4B schematically illustrate the structures shown in FIGS. 3A and 3B, respectively, after forming solder on a cross-shaped bonding pad to form a bonding structure on the bonding surface of the second substrate according to an embodiment of the invention, wherein FIG. 4A is a cross-sectional view of the second substrate taken along line 4A-4A in FIG. 4B, and wherein FIG. 4B is a plan view of the bonding surface of the second substrate.

FIGS. 6A and 6B schematically illustrate the stack structure of FIGS. 5A and 5B, respectively, which is formed following a solder reflow process according to an embodiment of the invention, wherein FIG. 6A is a schematic cross-sectional view of the stack structure shown in FIG. 5A at the completion of a solder reflow process in which the first and second substrates are aligned in the X, Y and Z directions, and wherein FIG. 6B is a plan view of FIG. 6A in a direction indicated by line 6B-6B in FIG. 6A.

FIGS. 9, 10, and 11 schematically illustrate a method for aligning and bonding a plurality of individual dies to a substrate using a single solder reflow process, according to an embodiment of the invention, wherein FIG. 9 is a schematic plan view of a substrate having a plurality of dies sites and alignment structures formed in a bonding surface of the substrate, wherein FIG. 10 is a schematic plan view of the substrate after an initial placement process in which individual dies are placed at each of the die sites, and wherein FIG. 11 is a schematic plan view showing the individual dies bonded to the bonding surface of the substrate in proper X-Y alignment (and Z alignment (not shown)) to the respective dies sites following a solder reflow and alignment process according to an embodiment of the invention.

DETAILED DESCRIPTION

Embodiments of the invention will now be discussed in further detail with regard to methods for aligning and bonding substrates together using alignment structures and solder reflow techniques which achieve self-alignment of the bonded substrates in three dimensions, as well as semiconductor structures that are formed using such methods. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form alignment structures and bond substrates together using methods as discussed herein. Rather, certain processing steps and tools that are commonly used for fabricating alignment structures and bonding and aligning semiconductor substrates, such as wafers, interposers, dies, etc., are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
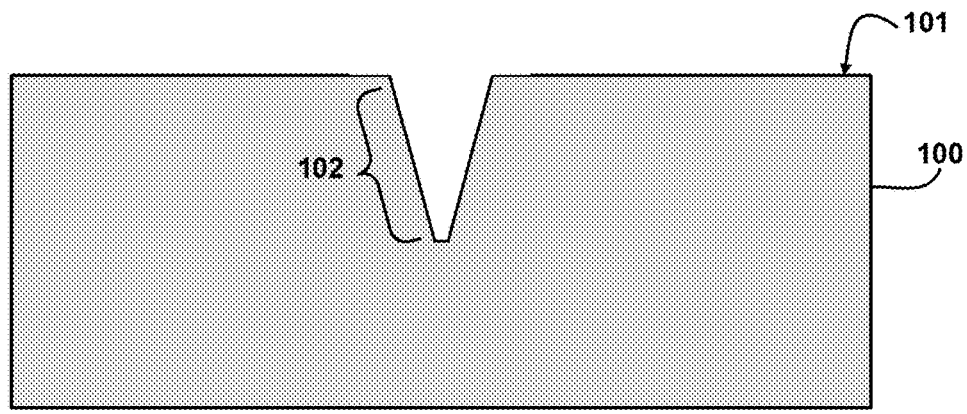
Figure 1B:
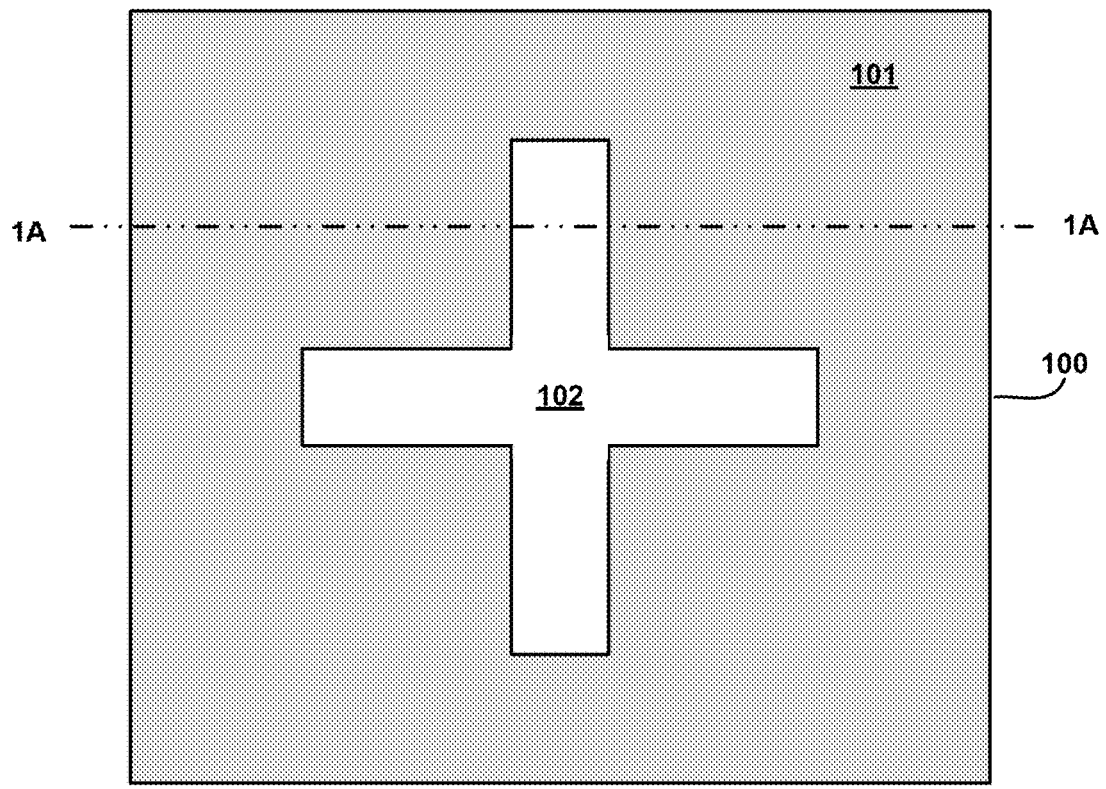

Methods for aligning and bonding substrates together using solder surface tension during solder reflow to achieve three-dimensional alignment of the substrates will now be discussed in further detail with reference to FIGS. 1A/1B, 2A/2B, 3A/3B, 4A/4B, 5A/5B, 6A/6B, 7 and 8, which schematically illustrate semiconductor structures at various stages of a wafer-to-wafer bonding and aligning process, according to an embodiment of the invention. In particular, FIGS. 1A and 1B are schematic views of a first substrate 100 at an initial stage of a bonding process in which an alignment trench 102 is formed in a bonding surface 101 of the first substrate 100. FIG. 1A is a cross-sectional view of the first substrate 100 taken along line 1A-1A in FIG. 1B, wherein FIG. 1B is plan view of the surface 101 of the first substrate 100.

In one embodiment of the invention, the first substrate 100 comprises a handler wafer which is to be bonded to a thin device wafer, for example. The first substrate 100 may comprise a glass handler or a silicon handler wafer, for example. Furthermore, in one embodiment of the invention, the alignment trench 102 is formed with sloping sidewalls, as depicted in FIG. 1A. The alignment trench 102 can be formed using known photolithography and etching processes, depending on the material (e.g., glass, silicon, etc.) of the first substrate 100. While example embodiments show the use of V-shaped trenches, other types of trench profiles with sloping sidewalls or non-sloping sidewalls, or a combination of sloping and non-sloping sidewalls, may be implemented.

In one embodiment of the invention, the alignment trench 102 comprises a cross-shaped pattern (as shown in FIG. 1B), although in other embodiments, the alignment trench 102 can be formed with other suitable alignment mark patterns which are commonly used in the field of semiconductor fabrication. While only one alignment trench 102 is shown in FIGS. 1A and 1B, it is to be understood that a plurality of alignment trenches are strategically formed in various surface regions of the first substrate 100 to facilitate bonding to a device wafer, as explained below with reference to FIG. 7, for example.

Figure 2A:
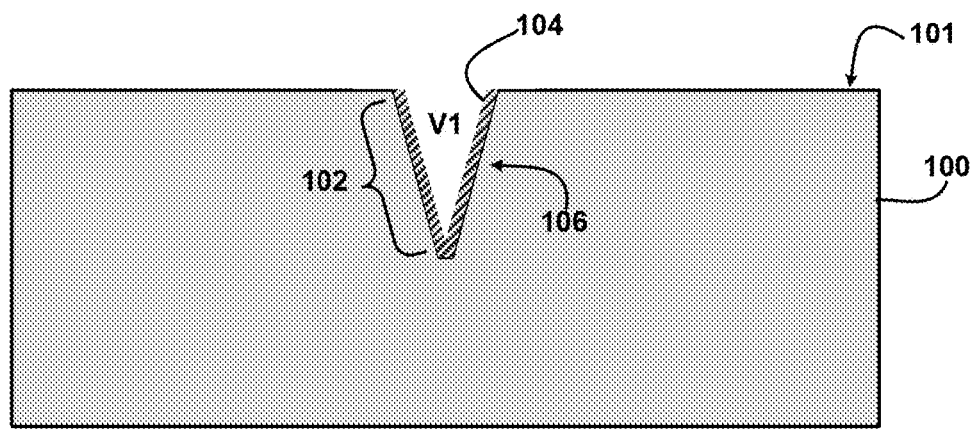
Figure 2B:
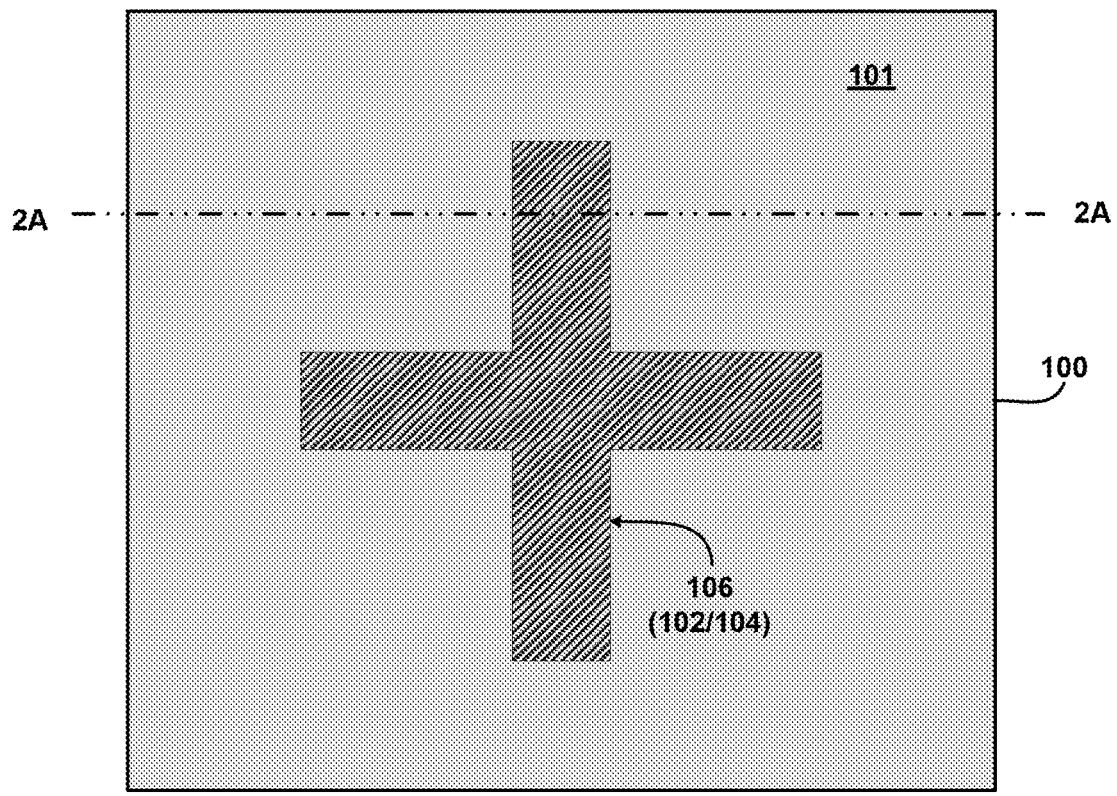

FIGS. 2A and 2B schematically illustrate next phase of the aligning and bonding process in which the alignment trench 102 is lined with a thin solder wetting layer 104 to form an alignment trench 102/wetting layer 104 structure 106 (or alignment structure 106). FIG. 2A is a cross-sectional view of the first substrate 100 taken along line 2A-2A in FIG. 2B, and FIG. 2B is plan view of the bonding surface 101 of the first substrate 100. In one embodiment of the invention, the wetting layer 104 is formed of one or more layers of metallic materials, such as copper or a copper alloy comprising Cr/Cu (chromium copper), although in other embodiments of the invention the wetting layer 104 can be formed of one or more layers of Ta, TaN, W, Ti, Al, Ni, Ni alloys, Au, Sn, etc., and other suitable alloys. The wetting layer 104 is configured to bond to a solder bump that is formed on a joining substrate during a solder reflow process (as discussed in further detail below). The material that is used to form the solder wetting layer 104 will depend on the materials that are used to form the solder bumps.

In one embodiment of the invention, the solder wetting layer 104 is a UBM (under bump metallurgy) structure that is formed using a standard BLM (ball limiting metallurgy) process. The wetting layer 104 can be formed by depositing one or more thin conformal layers of metallic material over the surface 101 of the first substrate 100 using PVD (physical vapor deposition), CVD (chemical vapor deposition) or electroplating techniques, or other deposition techniques for depositing thin conformal layers of metallic materials to form the wetting layer 104. In one embodiment, the wetting layer 104 is formed with a thickness in a range of about 0.1 μm to about 5 μm. Following the deposition process, an etch process (e.g. RIE (reactive ion etching), CMP (chemical mechanical polishing), etc.) is performed to remove the potion of the conformal wetting layer on the surface 101 of the first substrate 100, while leaving the remaining portion of the wetting layer 104 lining the sidewalls of the alignment trench 102. Following formation of the wetting layer 104, the alignment structure 106 has a cavity volume of V1, as shown in FIG. 2A.

Figure 3A:
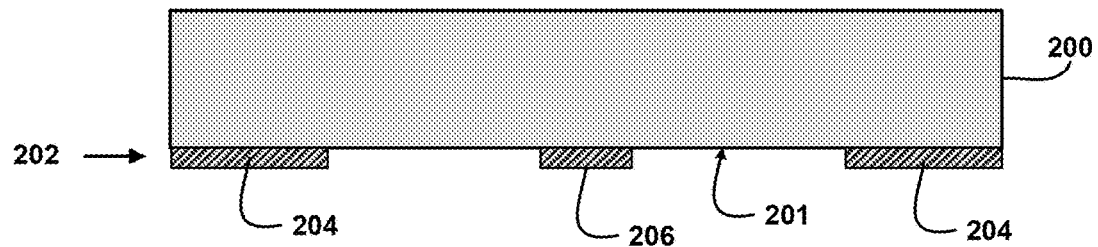
Figure 3B:
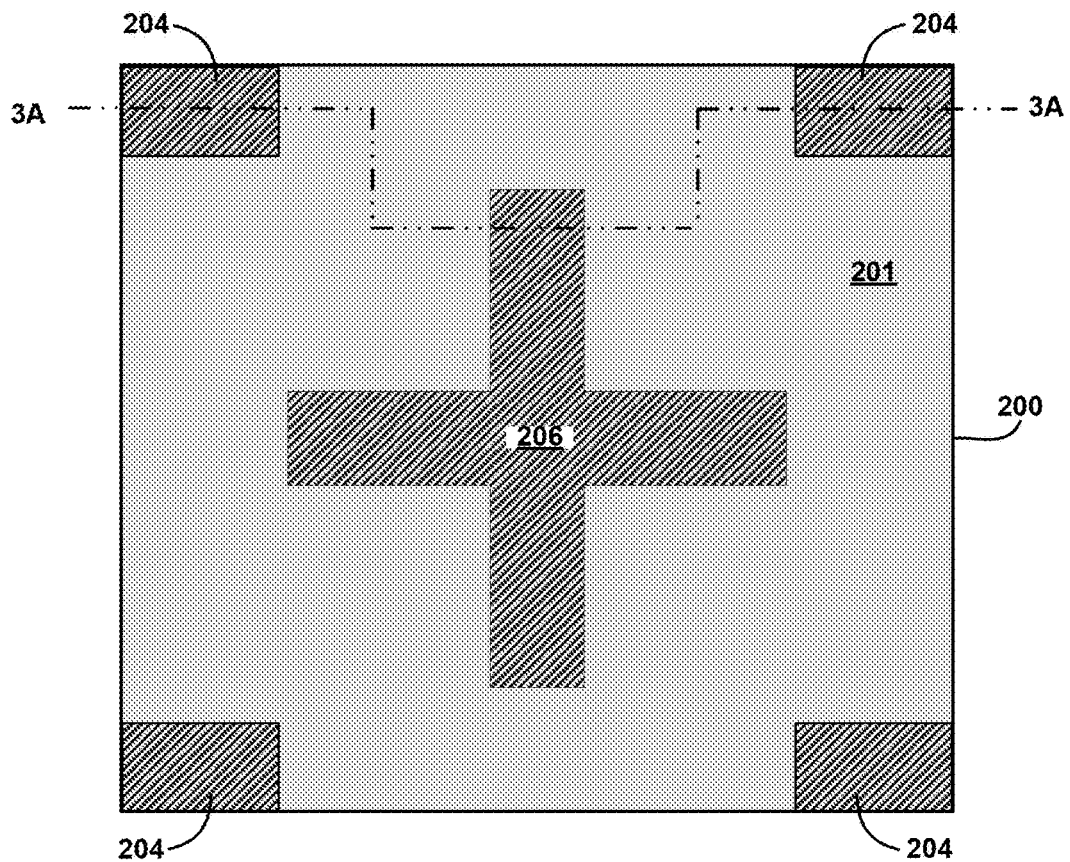

FIGS. 3A and 3B schematically illustrate another phase of the bonding process which comprises forming bonding metallization on a substrate which is to be bonded to the first substrate 100. In particular, FIGS. 3A and 3B are schematic views of a second substrate 200 having a bonding site metallization pattern 202 formed on a bonding surface 201 of the second substrate 200. FIG. 3A is a cross-sectional view of the second substrate 200 taken along line 3A-3A in FIG. 3B, and FIG. 3B is plan view of the bonding surface 201 of the second substrate 200. In one embodiment of the invention, the second substrate 200 comprises a semiconductor device wafer (e.g., silicon wafer, SiC wafer) which is to be aligned and bonded to the first substrate 100 which, as noted above, may comprise a glass handler or a silicon handler wafer, for example.

As shown in FIGS. 3A and 3B, the bonding site metallization pattern 202 comprises a plurality of vertical standoff pads 204, and a bonding pad 206. In one embodiment of the invention, the bonding site metallization pattern 202 is formed using standard UBM techniques and metallic materials, as discussed above. For example, the bonding site metallization pattern 202 can be formed of Ti, Ni, Cu, or Au, or a combination thereof (e.g., 0.03 μmTi/1 μm Cu/0.2 μm Ni/0.1 μm Au).

The bonding pad 206 comprises a pattern (e.g., cross-shaped pattern) that corresponds to the pattern of the alignment trench 104 formed on the surface 101 of the first substrate 100. In other embodiments of the invention, the alignment trench 102 (FIG. 1B) and corresponding bonding pad 206 can be formed to have other types of corresponding alignment mark patterns which are commonly used in the field of semiconductor fabrication. Furthermore, while only one bonding site metallization pattern 202 is shown in FIGS. 3A and 3B, it is to be understood that a plurality of the bonding site metallization patterns 202 may be strategically formed in various regions of the bonding surface 201 of the second substrate 200, which have bonding pads 206 that correspond to the alignment trenches 102 formed in various regions of the bonding surface 101 of the first substrate 100, to facilitate bonding the first and second substrates 100 and 200, as explained below with reference to FIG. 8, for example.

Figure 4A:
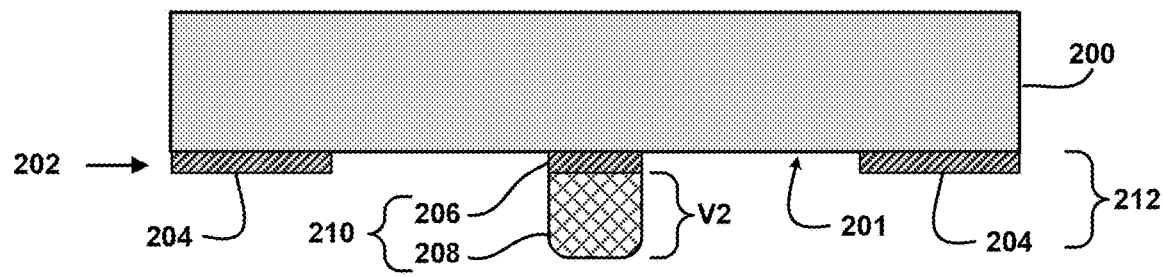
Figure 4B:
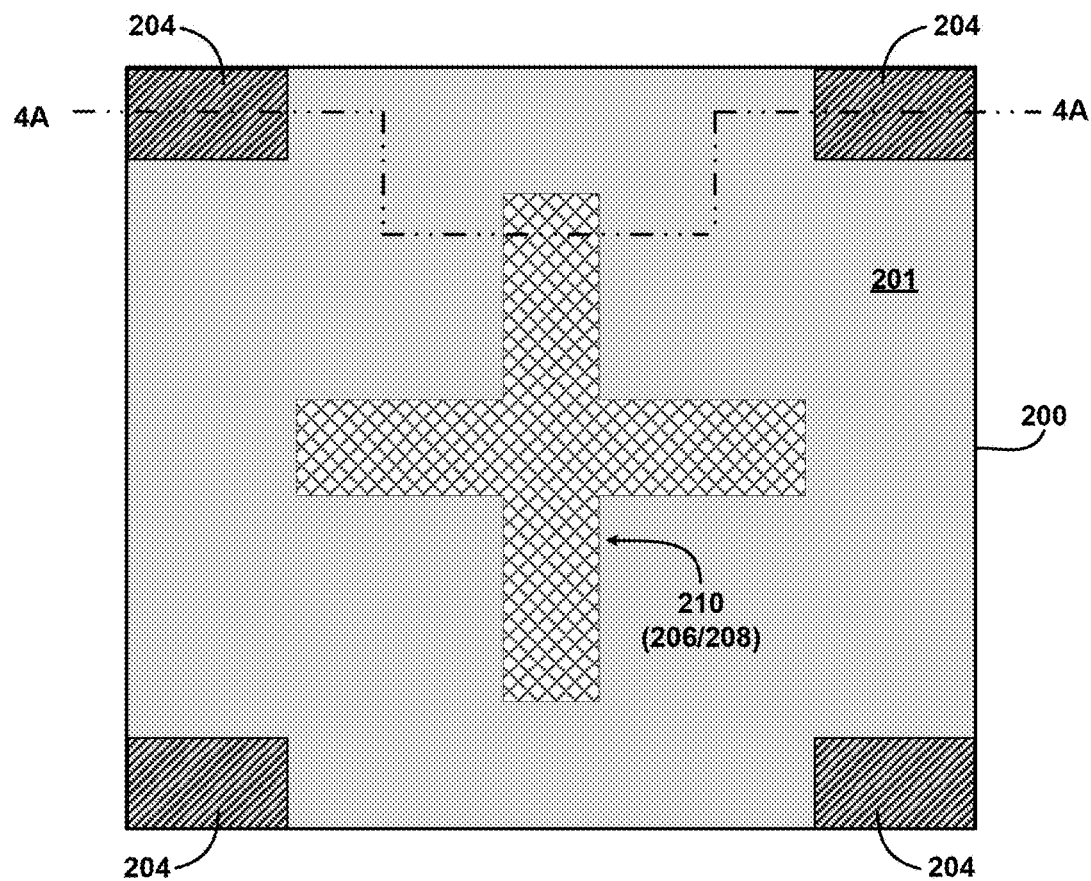

A next step in the process comprises depositing solder on the bonding pad 206. For example, FIGS. 4A and 4B schematically illustrate the structures shown in FIGS. 3A and 3B, respectively, after forming solder 208 on the cross-shaped bonding pad 206 to form a bonding structure 210. FIG. 4A is a cross-sectional view of the second substrate 200 taken along line 4A-4A in FIG. 4B, and FIG. 4B is a plan view of the bonding surface 201 of the second substrate 200. As shown in FIGS. 4A and 4B, solder 208 is formed on the bonding pad 206, while no solder is formed on the vertical standoff pads 204. It is to be understood that in one embodiment of the invention, the vertical standoff pads 204 and bonding structure 210 comprise an alignment structure 212 that is formed on the bonding surface 201 of the second substrate 200 to facilitate bonding and alignment of the first and second substrates in conjunction with the corresponding alignment structure 106 (e.g., alignment trench 102 and wetting layer 104) formed on the bonding surface 101 of the first substrate 100. In another embodiment, the alignment structure 212 may comprise the bonding structure 210 without the use of the vertical standoff pads 204, In one embodiment of the invention, solder 208 is deposited on the bonding pad 206 using known techniques such as an electroplating process, a solder paste printing process, a micro-ball drop process, or a molten solder injection process, for example. In one embodiment of the invention, the solder material that is utilized to form the solder 208 on the bonding pad 206 comprises a low temperature solder to facilitate a low temperature bonding process, which minimizes thermal stress and warpage. For example, the solder 208 may comprise a solder formed of In—Bi—Sn, In—Bi, In—Sn, Sn—Bi, or other similar solders having a melting point in a range of about 60 degrees Celsius to about 120 degrees Celsius. In one embodiment, the volume V2 of the solder 208 which is formed on the bonding pad 206 is less than the cavity volume V1 of the alignment structure 106 (FIG. 2A), in particular, V2<V1.

Figure 5A:
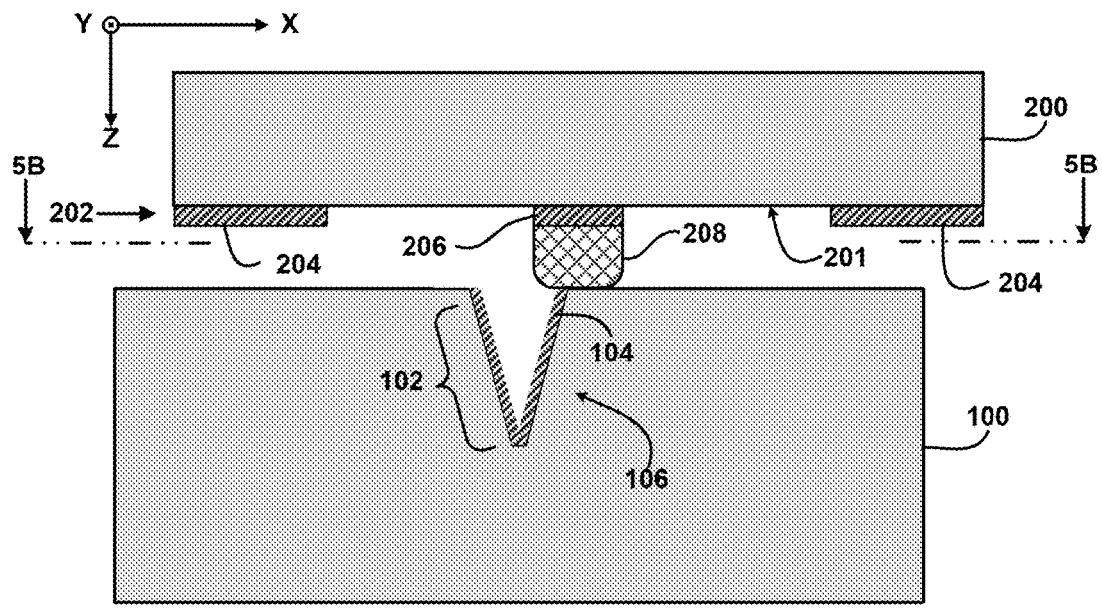
FIG. 5A is a schematic cross-sectional view of a pre-bonding stack structure that is formed after an initial placement step (prior to solder reflow) in which the second substrate is placed in position on the bonding surface of the first substrate according to an embodiment of the invention.
Figure 5B:
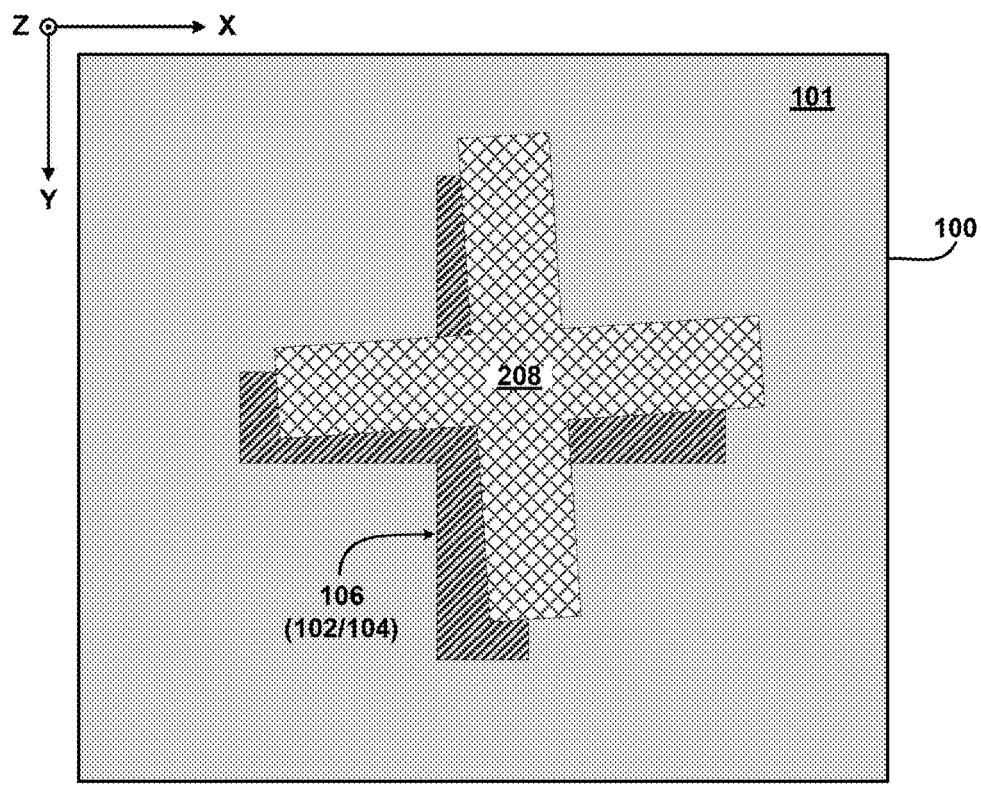
FIG. 5B is a plan view of the structure shown in FIG. 5A in a direction indicated by line 5B-5B in FIG. 5A.

Following formation of the alignment structure (e.g., trench 102 and wetting layer 104) on the first substrate 100 and the alignment structure (e.g., vertical standoff pads 204, bonding structure 210) on the second substrate 200, the first and second substrates 100 and 200 are bonded together using techniques that will now be discussed in further detail with reference to FIGS. 5A/5B and FIGS. 6A/6B. In general, FIGS. 5A/5B schematically illustrate an initial placement step in which the second substrate 200 is placed on the bonding surface 101 of the first substrate 100. More specifically, FIG. 5A is a schematic cross-sectional view of a pre-bonding stack structure after the initial placement step (prior to solder reflow) in which the second substrate 200 is placed in position on the bonding surface 101 of the first substrate 100 with at least a portion of the solder 208 on the bonding pad 206 in contact with the wetting layer 104 of the alignment trench 102. FIG. 5B is a plan view of FIG. 5A in a direction indicated by line 5B-5B in FIG. 5A.

As shown in FIGS. 5A and 5B, with the initial placement of the second substrate 200 on the first substrate 100, there is slight misalignment in both X and Y directions between the solder/bonding pad structure 210, and the alignment structure 106. Moreover, as specifically shown in FIG. 5A, there is a vertical misalignment in the Z direction between the bottom of the vertical standoff pads 204 and the bonding surface 101 of the first substrate 100.

The initial placement shown in FIGS. 5A/5B can be performed using a standard "pick and place" tool/process, as is known in the art. In one embodiment of the invention, when performing a wafer-to-wafer bonding process where, for example, the first substrate 100 is a handler wafer, and the second substrate 200 is a device wafer, the first substrate 100 is mounted on a chuck, such as a vacuum chuck or an electrostatic chuck to hold the first substrate 100 in place. As is known in the art, an electrostatic chuck comprises a metal base-plate and a thin dielectric layer, wherein the metal base-plate is maintained at a high-voltage relative to the wafer, which generates an electrostatic force that effectively clamps the wafer down to the chuck. A vacuum chuck utilizes a vacuum system to create a vacuum force in the chuck below the wafer to hold the wafer down to the chuck. With the first substrate 100 held in place on the chuck, the second substrate 200 is placed on top of the second substrate 200 using a pick and place machine (semi-automated or fully automated) which is configured to hold the second substrate 200 using a vacuum collet, and place the second substrate 200 onto the first substrate 100.

In another embodiment of the invention (as discussed below with reference to FIGS. 9, 10 and 11, for example) where the first substrate 100 comprises a handler wafer or a package interposer, or some other type of package substrate to which individual dies are to be mounted, for example, the process of FIGS. 5A/5B is performed using a standard pick and place tool/process for flip-chip technologies following a wafer dicing process. In general, wafer dicing involves mounting a wafer (which comprises a plurality of individual chips (or dies) formed thereon, for example) on a cutting ring, stretching wafer tape over back of the wafer, mounting the wafer on a dicing chuck, and cutting the wafer into individual dies using a diamond blade. With the wafer dicing process, the wafer is cut into individual dies without cutting through the wafer tape so that the individual dies remain attached to the wafer tape after the dicing process. Following wafer dicing, a pick and place machine (semi-automated or fully automated) is used to lift an individual die from the wafer tape (via a vacuum collet), and place the die onto the first substrate 100.

With an automated pick and place tool, the X and Y positioning is performed automatically using a pattern recognition system. As noted above with reference to FIG. 5B, for example, this initial placement results in a misalignment in the X and Y directions to some degree, which is the result of the tolerances of the placement of the pick and place tool used to initially position the second substrate 200 on the first substrate 100. For example, a pick and place tool can have a placement alignment accuracy tolerance of +/−10 µm. Depending on the lateral (X-Y) dimensions of the bonding pad/solder structure 210 and the alignment structure 106, there can be an even greater misalignment between the bonding pad/solder structure 210 and the alignment structure 106 on the initial placement because all that is needed is to have the solder 208 make contact to the wetting layer 104 to enable solder reflow, as explained below. Again, the maximum amount of misalignment (for the initial placement) between the bonding pad/solder structure 210, and the corresponding alignment structure 106 can vary depending on the lateral sizes of such structures in the X and Y directions—the greater the lateral size, the greater amount of misalignment can be tolerated.

After the pick and placement process is completed, a solder reflow process is initiated. With this process, starting with the stack structure shown in FIGS. 5A/5B, the solder 208 is heated using one of a variety of standard low temperature bonding techniques such as solder reflow using belt reflow tool, or a programmable hot plate. When the solder 208 begins to melt during the initial phase of the solder reflow process, the solder 208 become molten, and the molten solder 208 starts to heat up and bond to a portion of the wetting layer 104 which is contacted by the molten solder 208, thereby causing the molten solder 208 to flow into the alignment trench 102. During the solder reflow process, as the molten solder 208 flows into the alignment trench 102 and bond with the wetting layer 104, the surface tension forces of the molten solder 208 on the bonding pad 206 of the second substrate 200 are effective to induce movement of the second substrate 200 in the X, Y and Z directions to minimize the surface energy of the molten solder 208.

Figure 6A:
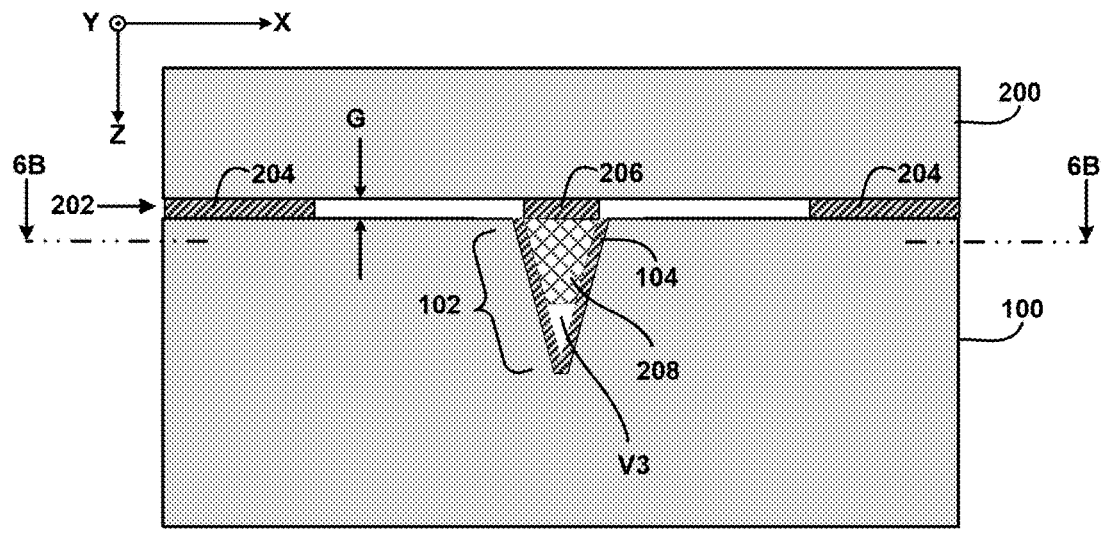
Figure 6B:
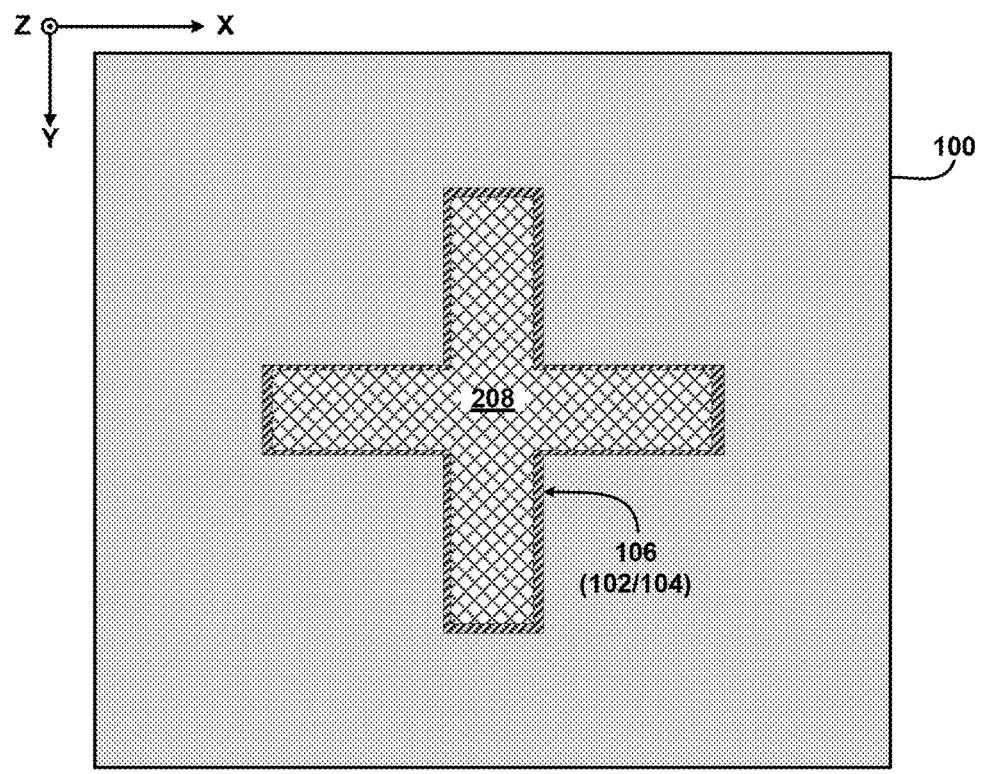

FIGS. 6A/6B schematically illustrate a stack structure comprising the second substrate 200 bonded to the first substrate 100, which is formed following a solder reflow process, according to an embodiment of the invention. More specifically, FIG. 6A is a schematic cross-sectional view of the stack structure shown in FIG. 5A at the completion of a solder reflow process in which the first and second substrates 100 and 200 are aligned in the X, Y and Z directions. FIG. 6B is a plan view of FIG. 6A in a direction indicated by line 6B-6B in FIG. 6A. As shown in FIGS. 6A and 6B, after solder reflow, the molten solder 208 in contact with the bonding pad 206 is completely disposed within the alignment trench 102, resulting in proper X-Y alignment between the corresponding patterns of the bonding pad 206 and the alignment trench 102, as well as proper alignment in the Z direction between the first and second substrates 100 and 200.

With regard to Z alignment, as shown in FIG. 6A, alignment in the Z direction is achieved by contact between the vertical standoff pads 204 of the second substrate 200 and the bonding surface 101 of the first substrate 100. During the solder reflow process, as the molten solder 208 flows into the alignment trench 102, the second substrate 200 is pulled towards the first substrate 100 until the vertical standoff pads 204 make contact to the bonding surface 101 of the first substrate 100. In this regard, the vertical standoff pads 204 serve as mechanical stops for Z-direction alignment during the solder reflow process in which the first and second substrates 100 and 200 are bonded together. During this process, since the first substrate 100 is mounted on the chuck and maintained flat by virtue of the electrostatic or vacuum force, the second substrate 200 is maintained flat because of the Z alignment. Indeed, in instances where the second substrate is thin and may have slight warpage, the Z alignment serves to flatten the second substrate 200 after being bonded to the first substrate 100.

As shown in the embodiment of FIG. 6A, the vertical alignment in the Z direction results in an alignment gap G between the bonding surfaces of the first and second substrates 100 and 200. The distance of the alignment gap G is determined by the thickness of the vertical standoff pads 204. In one embodiment of the invention, the gap G has a spacing of about 10 um or less. This gap G enables flattening of the second substrate 200 with minimum stress, and provides a space to insert a tool or materials to facilitate a subsequent debonding process, if required. It is to be understood that the vertical standoff pads 204 are optional features, and that in other embodiments of the invention, depending on the target application, the vertical standoff pads 204 are not utilized, and Z alignment is achieved by contact between the bonding surfaces of the first and second substrates 100 and 200 (i.e., there is no gap G).

It is to be appreciated that proper alignment in the X, Y and Z directions is achieved because the volume V2 of the solder 208 that is formed on the bonding pad 206 is not greater than the cavity volume V1 of the alignment structure 106. Indeed, in embodiments where the volume V2 of the solder 208 is less than the cavity volume V1, after the solder reflow process, the entire volume V2 of the solder 208 is completely disposed within the open cavity of the alignment structure 106. For example, as schematically illustrated in the embodiment of FIG. 6A, after the solder reflow process, the volume V2 of the solder 208 is completely disposed within the alignment structure 106, and there is a remaining volume V3 within the alignment structure 106 which does not contain any solder 208, wherein $V3 \approx V1-V2$.

If the volume V2 of the solder 208 was greater than the open cavity volume V1 of the alignment structure 106, the molten solder 208 would flow into the alignment trench 102, and a portion of the solder 208 would be disposed above the bonding surface 101 of the first substrate 100. This would potentially result some misalignment in the X and/or Y directions between the corresponding patterns of the bonding pad 206 and the alignment trench 102. In addition, this would result in misalignment in the Z direction between the first and second substrates 100 and 200 as the vertical standoff pads 204 would not make contact to the surface 101 of the first substrate 100.

In the example embodiments discussed above, while only one alignment structure 106 (on the first substrate 100) and corresponding alignment structure 212 (on the second substrate 200) are shown for illustrative purposes, it is to be understood that a plurality of the alignment structures 106 and corresponding alignment structures 212 may be formed to provide the solder tension forces needed move the second substrate 200 into place and achieve three dimensional alignment as discussed above. For example, for wafer-to-wafer bonding, assuming that the first substrate 100 is a handler wafer or package interposer, for example, and the second substrate 200 is a device wafer, for example, FIGS. 7 and 8 illustrate example layout patterns for a plurality of the alignment structures 106 and corresponding alignment structures 212 on the respective bonding surfaces of the first and second substrates 100 and 200.

Figure 7:
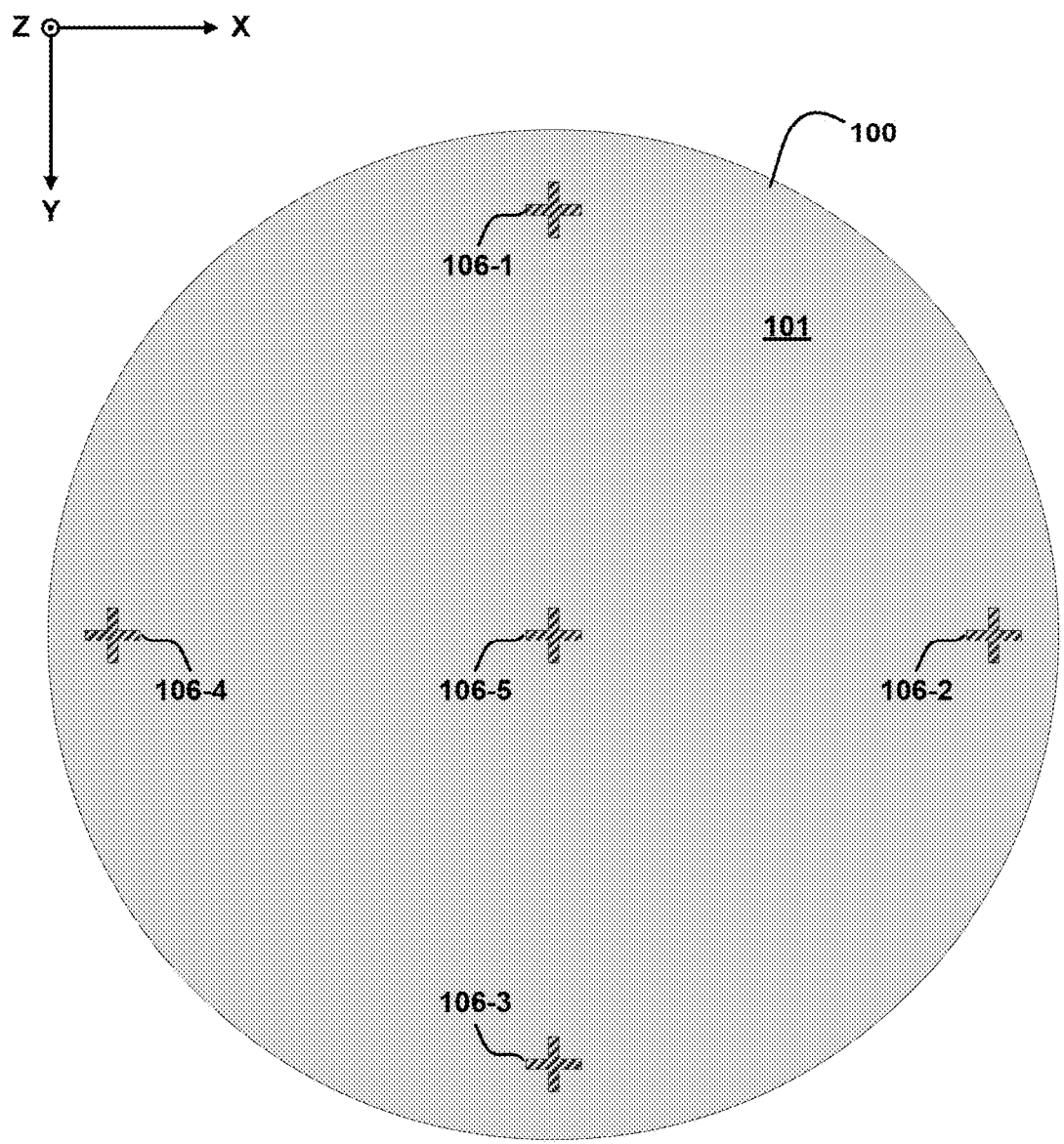
FIG. 7 schematically illustrates an example layout pattern for plurality of alignment structures comprising alignment trenches, which can be formed on the bonding surface of the first wafer, according to an embodiment of the invention.

In particular, FIG. 7 is a plan view of the first substrate 100 (e.g., handler wafer) having a plurality of alignment structures 106-1, 106-2, 106-3, 106-4, and 106-5 formed in the bonding surface 101 of the first substrate 100. Moreover, FIG. 8 is a plan view of the second substrate 200 (e.g., device wafer) having a plurality of alignment structures 212-1, 212-2, 212-3, 212-4, and 212-5 formed on the bonding surface 201 of the second substrate 200. As shown in the example embodiment of FIG. 8, each alignment structure 212-1, 212-2, 212-3, 212-4, and 212-5 comprises a bonding structure 210 and vertical standoff pads 204, which are the same or similar to the structures 204, 206, and 208 of the alignment structure 212 discussed above with reference to FIGS. 4A and 4B, for example.

In the example embodiment, the alignment structures 106-1, 106-2, 106-3, and 106-4 and corresponding alignment structures 212-1, 212-2, 212-3, and 212-4 are located 0, 90, 180, and 270 degree positions near the outer perimeter of the respective first and second substrates 100 and 200, while the alignment structure 106-5 and corresponding alignment structure 212-5 are positioned in a central region of the bonding surfaces of the respective first and second substrates 100 and 200. The alignment structure patterns shown in FIGS. 7 and 8 are sufficient for wafer-to-wafer bonding, although other alignment structure patterns may be implemented, depending on the application. In this regard, the total number and/or arrangement of the alignment structures, as well as the size of the trenches (e.g., area and/or volume) and a corresponding total solder volume and/or bonding pad area, which would be sufficient to provide proper alignment and bonding of substrates, will vary depending on the size and weight, for example, of the substrate that is moved into alignment by the solder surface tension during the solder reflow process.

Figure 8:
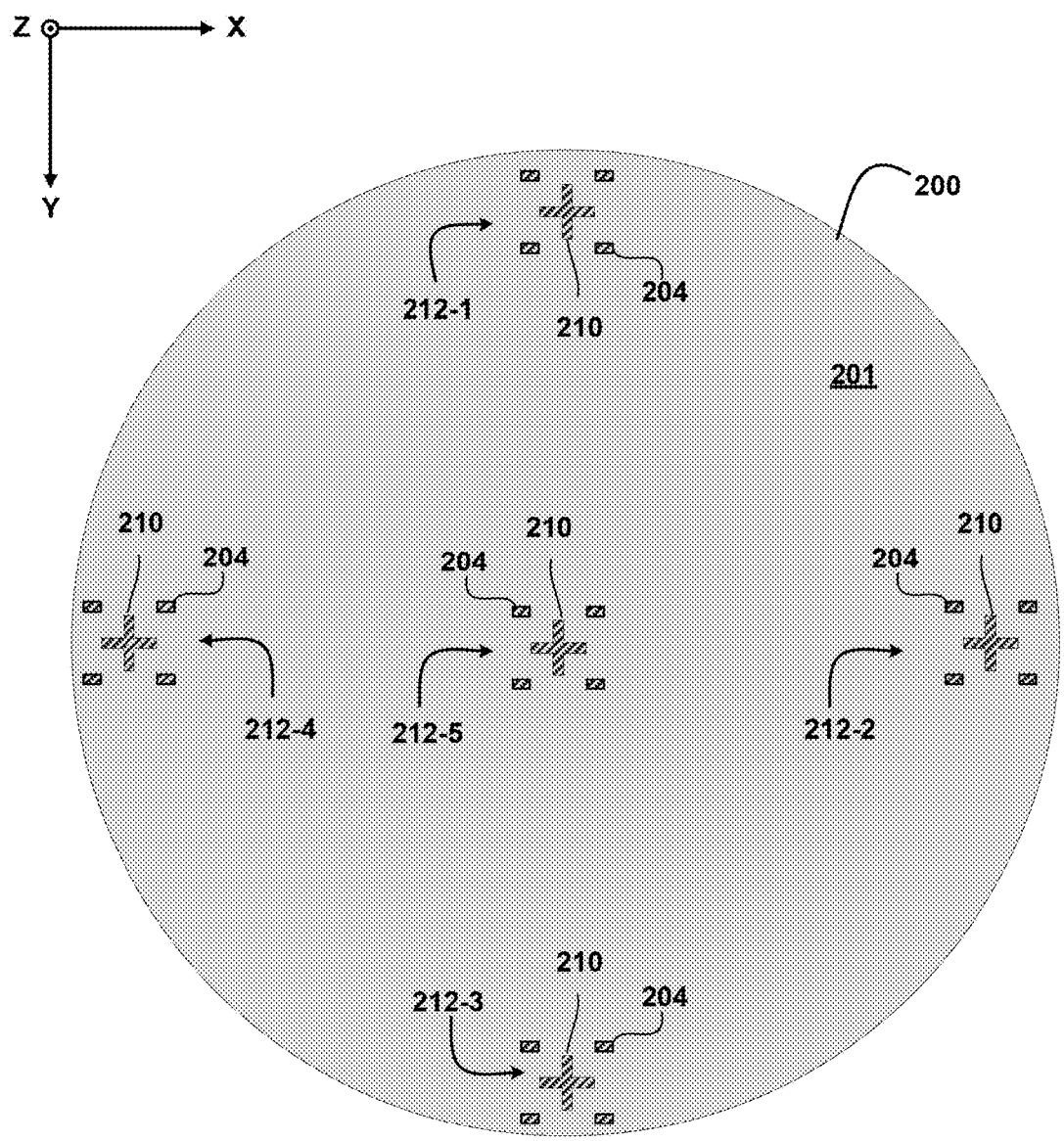
FIG. 8 schematically illustrates an example layout pattern for plurality of alignment structures comprising bonding pads and solder which can be formed on the bonding surface of the second wafer to correspond to the alignment structures on the bonding surface of the first wafer, according to an embodiment of the invention.

For example, in the embodiments of FIGS. 7 and 8, for example, it could be determined (through certain calculations) how much solder surface tension force would be required to move the second wafer 200 in alignment to the first wafer 100 during a solder reflow process. The required force would depend on the weight of the second wafer 200, for example. The width of the alignment trenches should be a least greater than the alignment tolerance (e.g., +/−10 um) of the pick and place tool that is used for the initial placement of the second wafer 200 on the first wafer 100. Once the total volume of solder is determined (which is needed to provide a surface tension force sufficient to move the wafer 200 based on the given weight of the wafer 200), the depth of the alignment trenches 102 can be determined based on the minimum trench width and the requisite solder volume. For example, the density of pure Sn is 10.2 g/cc, and the weight of a full thickness of a 200 mm silicon wafer is 40 g. Assuming that the weight of the solder needs to be at least ¼ of the weight of wafer, a total solder volume of 1.02 cc would be sufficient to provide the solder surface tension forces needed to move the wafer 200 into alignment.

Figure 9:
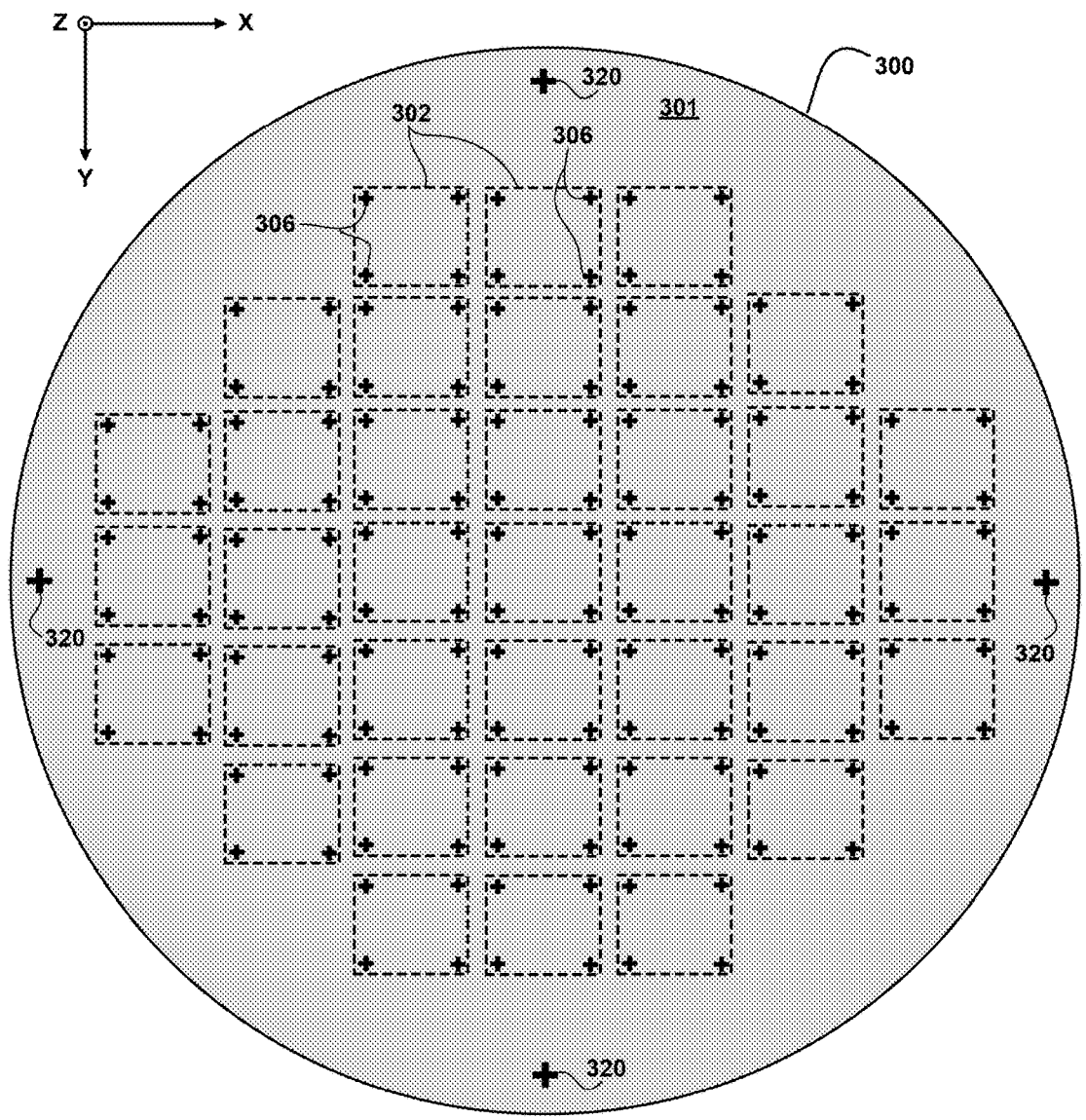
Figure 10:
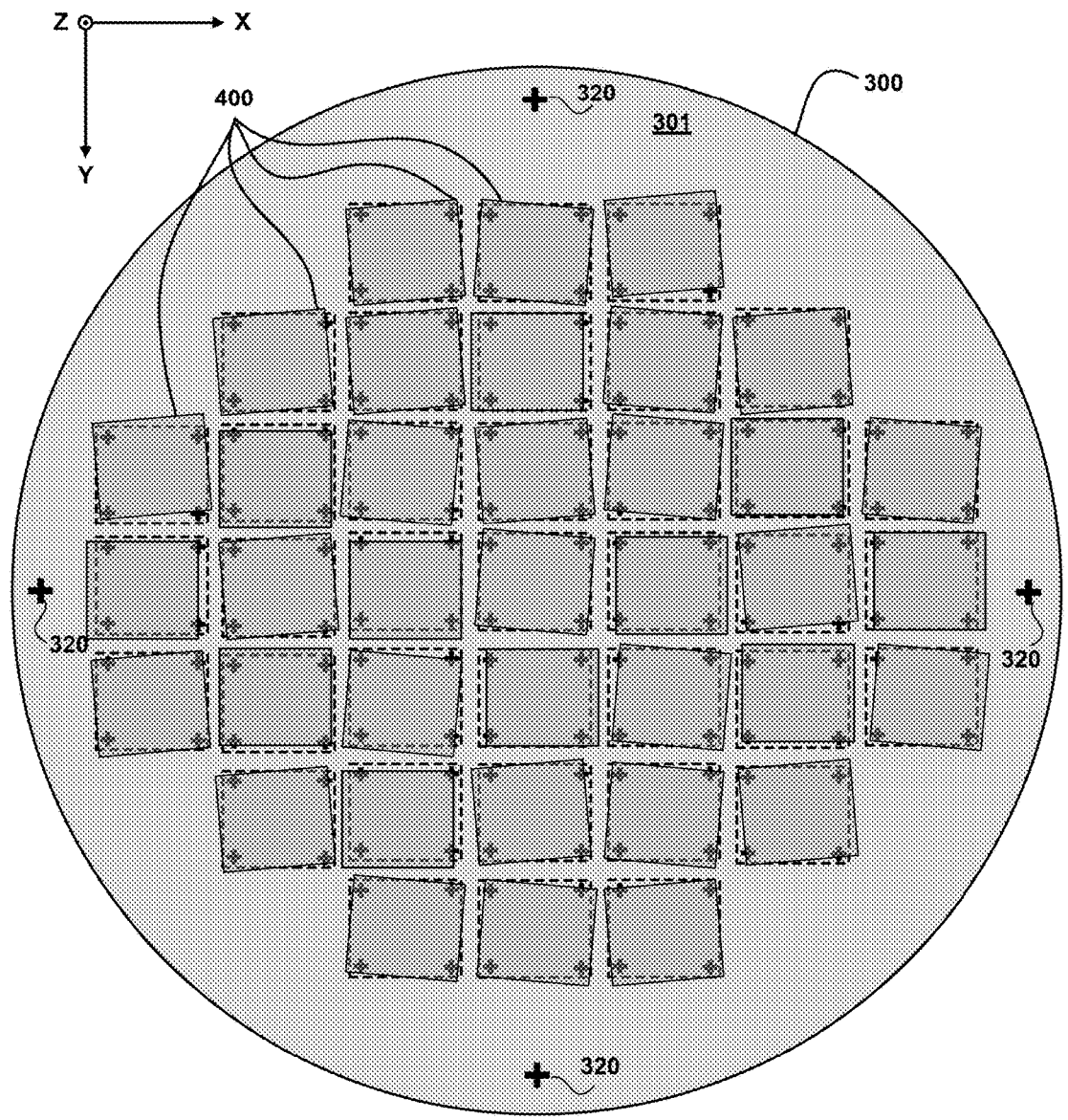
Figure 11:
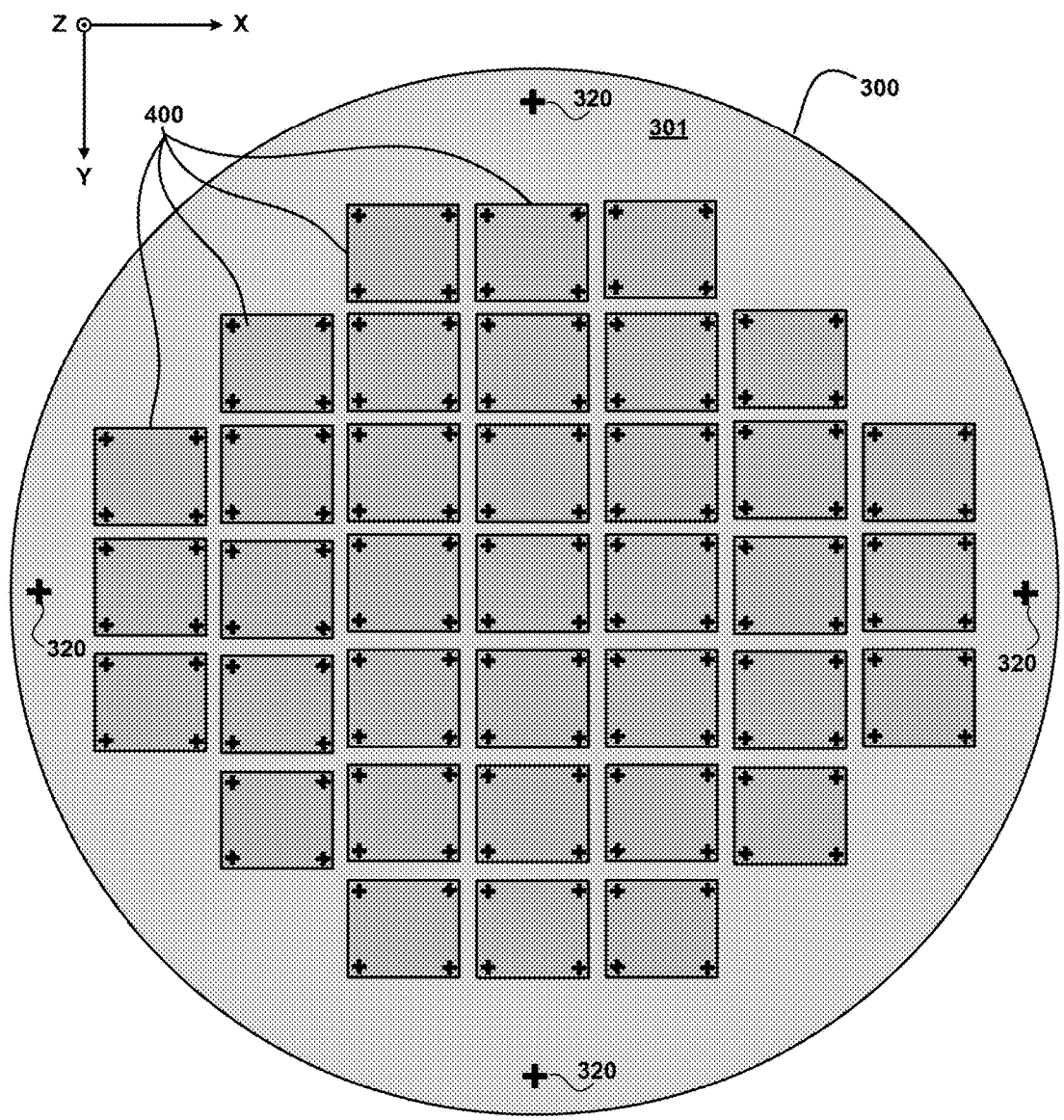

In other embodiments of the invention, the bonding and alignment techniques discussed herein can be implemented to align and bond three or more wafers together. Moreover, the bonding and alignment techniques discussed herein can be implemented to provide a low cost solution for die-to-wafer bonding, for example. By way of example, FIGS. 9, 10, and 11 schematically illustrate a method for bonding a plurality of individual dies to a substrate using a single solder reflow process. In particular, FIG. 9 is a schematic plan view of a substrate 300 having a plurality of dies sites 302 (indicated by rectangular-shaped dashed lines) and alignment trench/wetting layer structures 306 formed in a surface 301 of the substrate 300. The die sites 302 define regions in which individual dies are to be bonded to the surface 301 of the substrate 300 using techniques as discussed herein. The substrate 300 may be a handler wafer, package interposer, or any other type of package carrier that may be utilized for constructing 3-D semiconductor package structures.

As shown in the embodiment of FIG. 9, each of the die sites 302 comprises four cross-shaped alignment structures 306 that are formed within corner regions of the die sites 302. In one embodiment, the alignment structures 306 are the same or similar to the alignment structures 106 discussed above. In another embodiment of the invention, when the die size is small, two cross-shaped alignment structures 306 can be utilized for a given die site 302—one alignment structure 306 in the center region of the die site 302, and one alignment structure 306 in one of the corners of the die site 302. In addition, in the embodiment of FIG. 9, the substrate 300 comprises additional alignment marks 320 located at 0, 90, 180, and 270 degree positions near the outer perimeter of the substrate 300. The alignment marks 320 are utilized for wafer level processing to perform additional processing on the individual dies once the dies are aligned and bonded to the substrate 300.

FIG. 10 is a schematic plan view of the substrate 300 after an initial placement process in which individual dies 400 are placed at each of the die sites 302. This placement process can be implemented with a low accuracy (low cost) pick and place tool to place a plurality of individual dies 400 (which are diced from one or more different wafers) on the respective dies sites 302 with misalignment in the X and/or Y directions, as shown in FIG. 10. For illustrative purposes, the individual dies 400 are shown in phantom (transparent) in FIG. 10 to illustrate the X-Y misalignment between the dies 400 and the respective die sites 302. The plurality of dies 400 may be homogenous dies or heterogeneous dies with different sizes and different functions.

Although not specifically shown in FIG. 10, the individual dies 400 each have alignment structures formed on one surface thereof, which correspond to the four cross-shaped alignment trench/wetting layer structures 306 that are formed within the corner regions of the respective die sites 302. In one embodiment of the invention, the alignment structures (not specifically shown) that are formed on the bonding surfaces of the individual dies 400 can be the same or similar to the alignment structures 212 discussed above (e.g., structures 204 and 210 (206/208) as shown in FIGS. 4A and 4B). In another embodiment, alignment structures that are formed on the bonding surfaces of the individual dies 400 may include a pattern of cross-shaped bonding structures (e.g., structure 210 shown in FIGS. 4A/4B) which correspond to the pattern of cross-shaped alignment trench/wetting layer structures 306 formed on the substrate 300 at the respective die sites 302, while omitting the vertical standoff pads 204. In this embodiment, vertical alignment in the Z direction is achieved with contact between the bonding surfaces of the substrate 300 and dies 400.

Following the initial placement of the individual dies 400 as shown in FIG. 10, a solder reflow process is performed to bond the individual dies 400 to the surface 301 of the substrate 300 using solder reflow and alignment techniques as discussed above with reference to FIGS. 6A and 6B, for example. When bonding the individual dies 400 to the substrate 300, the use of a low temperature bonding process is not necessary. In this regard, in one embodiment of the invention, the individual dies 400 can be bonded to the substrate 300 using a solder reflow process in which the solder has a melting point in a range of about 60 degrees Celsius to about 350 degrees Celsius.

FIG. 11 is a schematic plan view showing the individual dies 400 bonded to the surface 301 of the substrate 300 in proper X-Y alignment to the respective dies sites 302 following a solder reflow and alignment process according to an embodiment of the invention. It is to be appreciated that solder reflow and alignment techniques as discussed herein allow all the individual dies 400 to be placed at one time on the substrate 300, and then perform a one-time solder reflow process to bond all the dies 400 to the substrate 300 with proper X, Y and Z alignment.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A method, comprising:
forming a first alignment structure on a first substrate, wherein the first alignment structure comprises an alignment trench formed in a bonding surface of the first substrate;
forming a second alignment structure on a bonding surface of a second substrate, wherein the second alignment structure comprises a bonding pad with solder formed on the bonding pad;
placing the bonding surfaces of the first and second substrates together with at least a portion of the solder of the second alignment structure in contact with at least a portion of the first alignment structure; and
performing a solder reflow process to cause the solder on the bonding pad to melt and flow into the alignment trench while pulling on the bonding pad to cause the second substrate to move into alignment with the first substrate in each of X, Y, and Z directions;
wherein the second alignment structure further comprises one or more standoff pads formed on the bonding surface of the second substrate, wherein alignment in the Z direction comprises contacting the one or more standoff pads to the bonding surface of the first substrate; and
wherein the one or more standoff pads and the bonding pad on the bonding surface of the second substrate have substantially equal thicknesses.

2. The method of claim 1, wherein the first alignment structure further comprises a wetting layer that is formed to line the alignment trench and facilitate the flow of solder into the alignment trench.

3. The method of claim 1, wherein alignment in the X and Y directions comprises laterally aligning a pattern of the alignment trench of the first substrate to a corresponding pattern of the bonding pad on the second substrate in both X and Y directions.

4. The method of claim 3, wherein the alignment trench and bonding pad are formed with corresponding cross-shaped patterns.

5. The method of claim 1, wherein the solder reflow process comprises a low temperature solder reflow process in which the solder has a melting point in a range of about 60 degrees Celsius to about 120 degrees Celsius to minimize thermal stress and warpage.

6. The method of claim 1, wherein a volume of the solder formed on the bonding pad is less than an open cavity volume of the alignment trench.

7. The method of claim 1, wherein the first substrate comprises a wafer or a glass substrate, and wherein the second substrate comprises a wafer.

8. The method of claim 1, wherein the first substrate comprises a handler wafer or a glass handler, and the second substrate comprises a device wafer.

9. The method of claim 1, wherein the first substrate comprises a wafer or package carrier, and wherein the second substrate comprises a semiconductor die.

10. A semiconductor structure formed by a process comprising:
forming a first alignment structure on a first substrate, wherein the first alignment structure comprises an alignment trench formed in a bonding surface of the first substrate;
forming a second alignment structure on a bonding surface of a second substrate, wherein the second alignment structure comprises a bonding pad with solder formed on the bonding pad;
placing the bonding surfaces of the first and second substrates together with at least a portion of the solder of the second alignment structure in contact with at least a portion of the first alignment structure; and
performing a solder reflow process to cause the solder on the bonding pad to melt and flow into the alignment trench while pulling on the bonding pad to cause the second substrate to move into alignment with the first substrate in each of X, Y, and Z directions;
wherein the second alignment structure further comprises one or more standoff pads formed on the bonding surface of the second substrate, wherein alignment in the Z direction comprises contacting the one or more standoff pads to the bonding surface of the first substrate; and
wherein the one or more standoff pads and the bonding pad on the bonding surface of the second substrate have substantially equal thicknesses.

11. The semiconductor structure of claim 10, wherein the first alignment structure further comprises a wetting layer that is formed to line the alignment trench and facilitate the flow of solder into the alignment trench.

12. The semiconductor structure of claim 10, wherein alignment in the X and Y directions comprises laterally aligning a pattern of the alignment trench of the first substrate to a corresponding Hall pattern of the bonding pad on the second substrate in both X and Y directions.

13. The semiconductor structure of claim 12, wherein the alignment trench and bonding pad are formed with corresponding cross-shaped patterns.

14. The semiconductor structure of claim 10, wherein a volume of the solder formed on the bonding pad is less than an open cavity volume of the alignment trench.

15. A method, comprising:
forming a pattern of first alignment structures on each of a plurality of die sites on a bonding surface of a substrate, wherein each of the first alignment structures comprises an alignment trench formed in the bonding surface of the substrate;
forming a pattern of second alignment structures on a bonding surface of each of a plurality of dies, wherein each of the second alignment structures comprises a bonding pad with solder formed on the bonding pad;
placing each of the plurality of dies at a respective one of the plurality of dies sites on the bonding surface of the substrate, with at least a portion of the solder of the second alignment structures in contact with at least a portion of the corresponding first alignment structures; and
performing a solder reflow process to cause the solder on the bonding pads to melt and flow into the corresponding alignment trenches while pulling on the bonding pads to cause each of the plurality of dies to move into alignment with the respective one of the plurality of dies sites in each of X, Y, and Z directions;
wherein the second alignment structures further comprise one or more standoff pads formed on the bonding surfaces of the dies, wherein alignment in the Z direction comprises contacting the one or more standoff pads to the bonding surface of the substrate; and
wherein for a given die, the one or more standoff pads and the bonding pad on the bonding surface of the given die have substantially equal thicknesses.

16. The method of claim 15, wherein the plurality of dies comprise at least one of homogenous dies and heterogeneous dies with different sizes and different functions.

17. The method of claim 15, wherein the first alignment structures further comprise a wetting layer that is formed to line the alignment trench and facilitate the flow of solder into the alignment trench.

18. The method of claim 15, wherein alignment in the X and Y directions comprises laterally aligning patterns of the alignment trenches of the first substrate to corresponding patterns of the bonding pads of the dies in both X and Y directions.

19. The method of claim 18, wherein the alignment trenches and bonding pads are formed with corresponding cross-shaped patterns.

20. The method of claim 15, wherein the solder reflow process comprises a low temperature solder reflow process in which the solder has a melting point in a range of about 60 degrees Celsius to about 120 degrees Celsius to minimize thermal stress and warpage.

* * * * *